United States Patent

Ohmi et al.

[11] Patent Number: 5,854,116
[45] Date of Patent: Dec. 29, 1998

[54] SEMICONDUCTOR APPARATUS

[76] Inventors: Tadahiro Ohmi, 1-17-301 Komegabukuro, 2-chome, Sendai-shi, Miyagi-ken 980, Japan; Tadashi Shibata, 19-1393, Aza-Koshizi, Nagamachi, Sendai-shi, Miyagi-ken 980, Japan; Masaru Umeda, 2-16, Nihonbashi-Muromachi, 4-chome, Chuo-ku, Tokyo 103, Japan

[21] Appl. No.: 422,640

[22] Filed: Apr. 14, 1995

Related U.S. Application Data

[63] Continuation of Ser. No. 110,329, Aug. 23, 1993, abandoned, which is a continuation of Ser. No. 781,077, Oct. 21, 1991, abandoned, which is a continuation of Ser. No. 391,560, Jul. 25, 1989, abandoned.

[30] Foreign Application Priority Data

Jan. 20, 1987 [JP] Japan ........................... 62-2001

[51] Int. Cl.$^6$ ................................. H01L 21/20
[52] U.S. Cl. .................... 438/330; 438/331; 438/332; 438/385
[58] Field of Search .................... 437/170, 171, 437/172, 225; 438/330, 331, 332, 385

[56] References Cited

U.S. PATENT DOCUMENTS 3,451,912  6/1969  D'Heurle et al. .................. 204/192.25

OTHER PUBLICATIONS

Colclaser, Microelectronics: Processing and Device Design, Wiley & Sons 1980, p. 119.
Wolf, Silicon Processing for the VLSI Era, vol. 1, Lattice Press, 1986, pp. 384–386.

*Primary Examiner*—Robert Kunemund
*Attorney, Agent, or Firm*—Baker & Daniels

[57] ABSTRACT

The present invention relates to a semiconductor apparatus adapted to a ultrahigh density integration process.

A semiconductor apparatus of the present invention is characterized by including a high concentration impurity layer with the same type of conductivity as that of a semiconductor wafer provided on the back of the semiconductor wafer, and at least one layer of a low resistance electrode provided on said high concentration impurity layer.

15 Claims, 8 Drawing Sheets

50 µm

50 µm

50 μm

50 μm

50 μm

50 μm

SEMICONDUCTOR APPARATUS

This is a continuation of application Ser. No. 08/110,329, filed Aug. 23, 1993 now abandoned, which is a continuation of application Ser. No. 07/781,077, filed Oct. 21, 1991 now abandoned, which is a continuation of application Ser. No. 07/391,560, filed Jul. 25, 1989.

TECHNICAL FIELD

The present invention relates to a semiconductor apparatus adapted to a ultrahigh density integration process.

BACKGROUND OF THE INVENTION

Presently, the degree of integration of LSIs is very rapidly increasing, and active studies and developments are in progress to assure constituent elements with minimum sizes of from 0.5 $\mu$m to 1 $\mu$m or less. In order to precisely control sizes of such fine elements and assure excellent characteristics and reliability thereof, it is very important to develop fine processing technology as well as high quality materials of all sorts for use in fabrication of semiconductor devices (semiconductor wafers, insulating materials, and metal films, etc.).

Therefore, in fabrication of very large scale integrated circuits, processes of etched film formation, etc., using electrical discharge such as reactive ion etching (RIE) and bias sputtering become increasingly important. These processes are adapted, as features thereof, to accelerate the associated ions by making use of a potential difference produced between the plasma and a wafer to force those ions to bombard a wafer surface, and to thereby assure the directional property of the etching and the high quality of a grown film deponding on their kinetic energy.

The wafer potential is therefore most important and the fine and precise control thereof is a key factor in such a process. However, in the present plasma application process, the potential control of the wafer is very insufficient.

In succession, prior problems produced upon the use of a semiconductor wafer will be described, taking as an example a case of growing an 1 film with use of bias sputtering.

FIG. 2 is a view illustrating a bias sputtering apparatus adopting a combined DC and RF excitation system, which has already been applied by the present inventor (Japanese Patent Application No. 61-131188).

This bias sputtering apparatus is adapted to effectively discharge Ar gas introduced into a chamber 202 by making use of a RF power source of 100 MHz, and forcing Ar$^+$ ions produced thereby to bombard an Al target 203 by sputtering. Al atoms freed from the target by the sputtering are allowed to arrive at the silicon wafer 205 surface provided on a wafer holder 204 and adsorbed thereon for permitting an Al film 206 to grow. The target can be set in its potential to an arbitrary value by a DC power source 207 and is actually adapted to be effectively sputtered by setting it to 500 V to 1000 V. In addition, the wafer holder can also be set at its potential by a DC power source 208 and the surface of the growing Al film 206 can be resputtered by Ar ions by setting it to a proper negative value. Japanese patent Application No. 61-131188 and Technical Report of Japanese Electronic Communication Association, Vol. 86, No. 138, SSD 86-55 (1986-8) describe the aforementioned apparatus in detail.

This apparatus will assure a good Al film by applying a bias potential of for example from −30 V to −40 V to the wafer holder 204. The reason is as follows: It is found from the associated data collected up to now that a minimum voltage where bulk Al can be sputtered by Ar ions, i.e., threshold voltage of the sputtering, is about 50 V (FIG. 3(a), "RF Bias Sputtering with Ion Energy Precisely Controlled" by Kiyota, Kuwahara, Ohmi, and Shibata, Technical Report of Electronic Communication Association, Vol. 86, No. 138, SSD 86-55 (1986-08)). This is considered to correspond to energy needed to sputter Al atoms located at normal lattice points of a bulk crystal. FIG. 3(b) illustrates the dependency of film formation factors on the substrate bias voltage. The film formation factors here denote film formation rates divided by current density of ions incident upon the target. As evidenced from the figure, the film formation factors are substantially kept constant against the bias voltage from 0 V to −20 V, and then reduced as the bias voltage is increased beyond −20 V. This shows the threshold voltage of the resputtering to be −20 V, which is considered to correspond to the minimum energy required for the Al atoms absorbed on the bulk crystal at locations thereof other than the normal lattice points to be sputtered. We therefore believe that if the resputtering of a growing Al film is conducted with use of voltage of substantially from −30 V to −40 V, selective resputtering only for Al atoms absorbed on the locations thereof other than the normal lattice points will occur, and that a high quality Al film can be formed because of the wafer surface being activated by the kinetic energy of the Al ions incident thereupon.

So, an experiment of the formation of an Al film with the thickness of about 1.5 $\mu$m will be described where the Al film is formed by placing an N type (100) silicon wafer with specific resistance ranging from 5 to 10$\Omega$·cm the wafer holder 204 of the present prior apparatus, and-setting the power source 208 to 0 V and −40 V.

FIGS. 4(a) and (b) are photographs of surface of the Al film observed with use of a Nomalsky type differential interference microscope. (a) shows the result of Al film biased with voltage −40 V, and (b) the same biased with 0 V. As evidenced from the figures, the surface biased at −40 V is slightly improved in flatness compared with the case of OV, but both are yet uneven. Such microscopic unevenness deteriorates reflectance of the Al film at the surface thereof. For instance, even if an alignment mark for automatic mask alignment is prepared by patterning of such an Al film, accuracy of the alignment is unsuccessful. In addition, a heat treatment of any of the Al films illustrated in FIGS. 4(a) and (b) causes the appearance of hillocks followed by severe unevenness on the surface, as depicted in FIGS. 5(a) and (b). These hillocks have sizes thereof ranging from about 0.5 to 1 $\mu$m, and hence make it substantially impossible to precisely form a submicron wiring pattern.

Moreover, it is well known upon forming a multi-layer wiring structure that a problem is produced such as a short-circuit between the lower and upper wirings owing to those hillocks.

As described above, the application of the bias of −40 V did not improve film quality much with respect to the production of an uneven surface and hillocks, unlike the prediction.

The reason is that insufficient ohmic contact between the silicon wafer 205 and the metal wafer susceptor prevents the wafer potential from reading a constant value equal to an external DC potential.

A contact between metal and semiconductor generally causes a Schottky barrier at the interface therebetween to thereby assure a rectifying property. In particular, when in the apparatus of FIG. 2 the potential of −40 V is applied to the wafer holder, the metal is negatively biased with respect to the n type silicon and results in the Schottky diode being back biased. The silicon wafer 205 is hereby actually caused to be in a floating state, the potential of which gets substantially equal to the floating potential in the plasma. That is, the insufficient ohmic contact between the wafer and the wafer holder prevents satisfactory voltage from being applied between the wafer and the plasma, with the result of no effect of the resputtering.

As evidenced from this example, it is needed to securely establish the ohmic contact between the silicon wafer and the wafer holder for the purpose of securing the wafer potential in the plasma application process.

To solve this, there is also known a method of for example providing a highly concentrated n type layer ($10^{20}$ cm$^{-3}$ or more in impurity concentration) on the back side 209 of the n type silicon wafer 205. However, also in this case, a satisfactory contact may not be obtained owing to the effect of a natural oxide film formed on the n$^+$ layer surface.

Successively, FIG. 6 is a cross section illustrating a state of an IC chip 601 mounted on a package substrate by a conventional method. An n type Si substrate 601 of specific resistance of 10 Ωcm for example includes an LSI circuit formed on its principal plane 603. The back of the chip is lapped, and then Au (gold) 604 is deposited thereon. This back of the chip is bonded onto a package substrate 602, the surface of which is also coated with Au, with the use of AuSi soldering paste. However, in such a structure where the n type Si substrate 601 with impurity concentration from about $10^{15}$ to $10^{16}$ cm$^{-3}$ and the Au deposited layer 604 make contact with each other, a current produced by recombination of carriers at the interface therebetween is dominant, and hence satisfactory ohmic contact is not necessarily established. Accordingly, LSIs, which operate at high speeds in particular, suffer from a problem of fluctuating substrate potential owing to an applied signal. To eliminate this problem, there is known a method wherein an n$^+$ region 605 is provided on the chip surface from which the chip potential is dropped to that of the package substrate 602 through a bonding wire 606. However, the difficulty is also produced in this case that clamping of the potential through such a fine wire is incomplete owing to self inductance of the wire, etc., which results in a margin of the chip for the high speed operation thereof being reduced.

The foregoing mentioned, taking as examples, two cases of the formation of an Al film with use of the bias-sputtering and of the packaging of an IC chip, that the precise control of the silicon substrate potential was very important not only in the film formation process but upon the packaging of an IC chip. It was furthermore pointed out that the existing techniques were extremely unsatisfactory in either case.

In view of the drawbacks of the prior techniques, it is an object of the present invention to provide a semiconductor wafer and a semiconductor apparatus, both being capable of precisely controlling the potential of a semiconductor substrate.

SUMMARY OF THE INVENTION

A semiconductor apparatus according to the present invention is characterized by including a high concentration impurity layer with the same type of conductivity as that of a semiconductor wafer disposed on the back of the semiconductor wafer, and at least one layer of low resistance electrode disposed on the high concentration impurity layer.

With the arrangement of the semiconductor apparatus of the present invention, precise control of the potential of a semiconductor substrate can be achieved not only during the process of wafer formation but after chip packaging. Hereby, ultra-high density and ultra-high speed LSIs can be realized.

BRIEF DESCRIPTION OF THE DRAWINGS

FIGS. 1(*b*) and (*c*) are photographs, taken by a differential interference microscope, of a surface of Al formed on the surface of a wafer according to the embodiment of FIG. 1 by making use of bias sputtering, in which (b) illustrates a state of the surface immediately after the sputtering and (c) another state of the same;

FIG. 1(*d*) is a view illustrating a change in a crystalline property of the Al film caused by a bias to the semiconductor wafer;

FIGS. 5(*a*) and (*b*) are photographs showing the surfaces of the metal texture of the same sample as in FIGS. 4(*a*) and (*b*) after annealing thereof for 30 minutes at 400° C.

DESCRIPTION OF THE PREFERRED EMBODIMENT

FIG. 1(*a*) is a cross section illustrating a first embodiment of a semiconductor apparatus of the present invention. In the same figure, an n type silicon wafer 101 for example has a specific resistance of for example from 5 to 10Ω cm. The silicon wafer 101 includes an N$^+$ layer 103 on the back thereof which has an n type impurity concentration of for example $1 \times 10^{19}$ cm$^{-3}$ or more. The silicon wafer 101 further includes on the surface thereof a tungsten silicide layer (WSi$_2$) 102 with a thickness of from about 0.05 to 0.1 μm.

Figure 2:
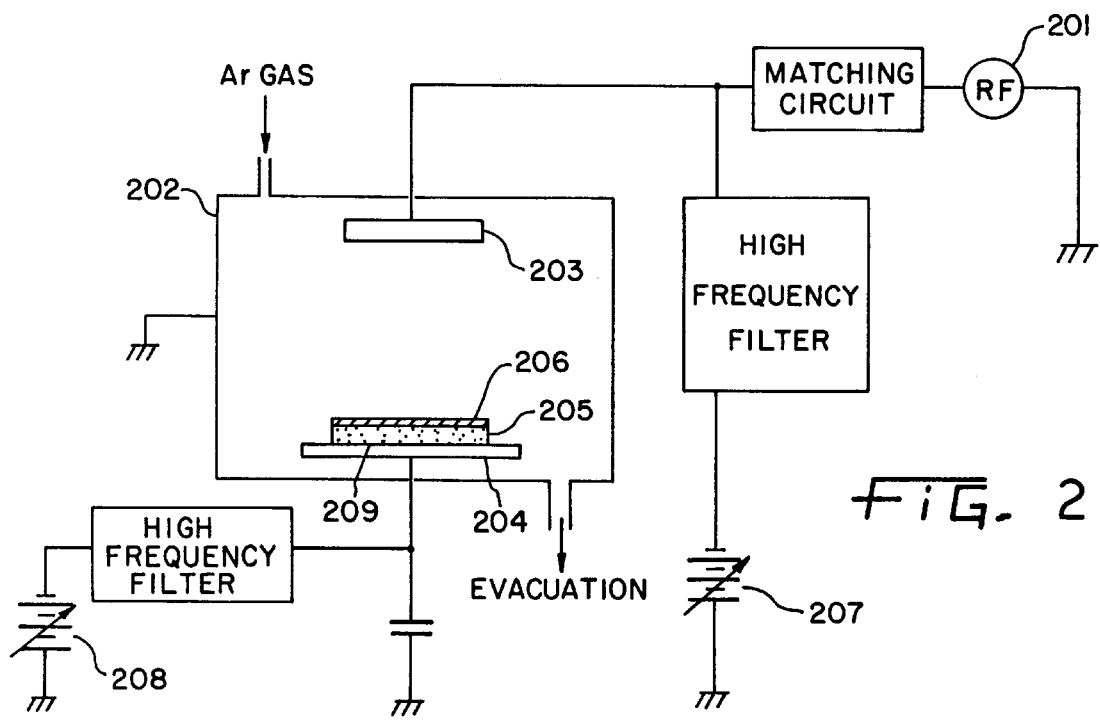
FIG. 2–6 are illustrations describing the prior art techniques, and in those figures, FIGS. 4(*a*) and (*b*) are photographs showing surface Al metal texture immediately after the sputtering respectively at bias voltages of 0 V and –40 V.
Figure 3A:
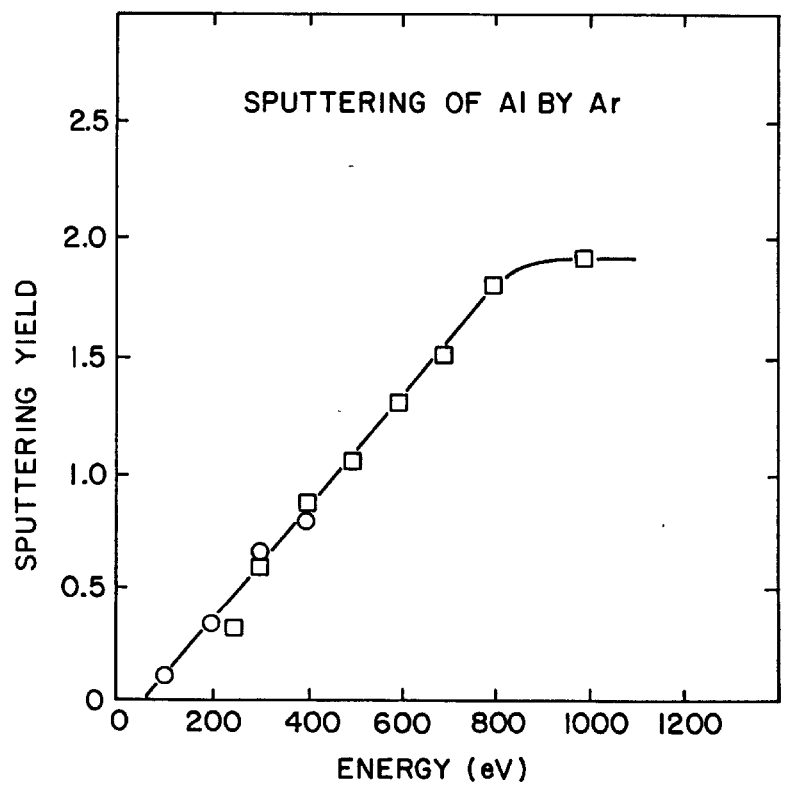
Figure 3B:
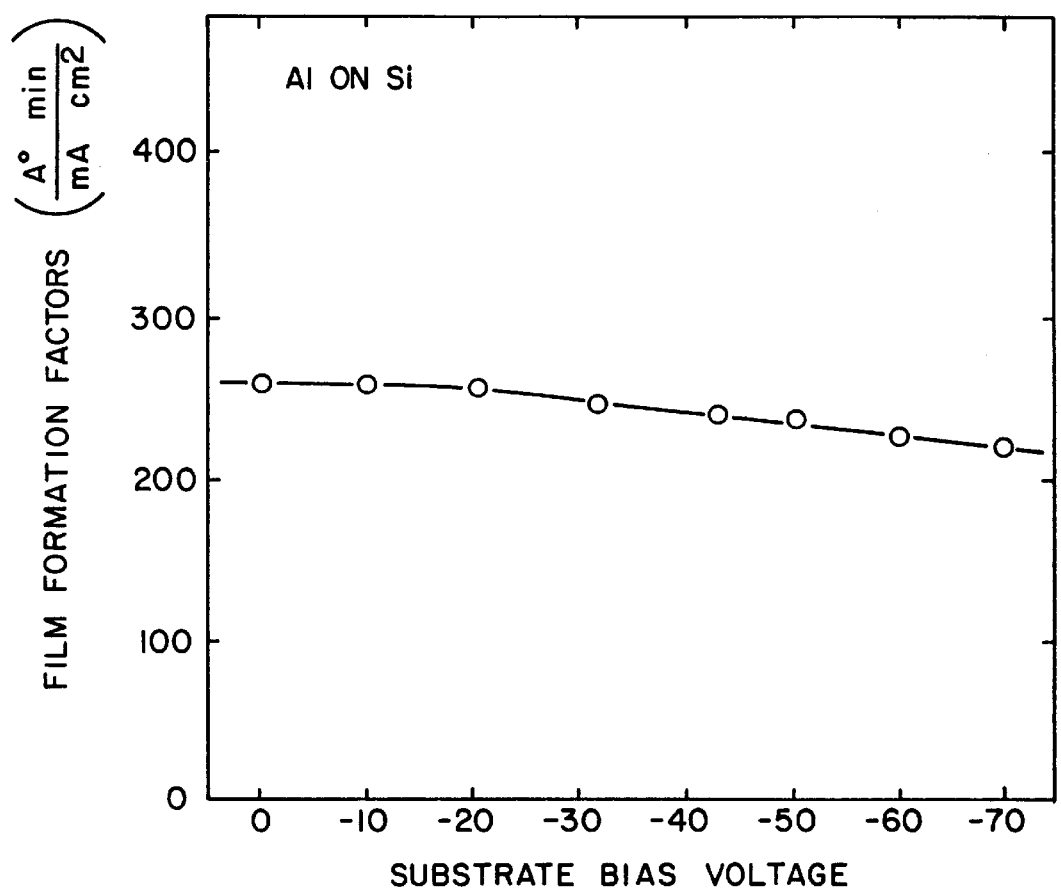

The silicon wafer so arranged is employed to form an Al film with a thickness of about 1.5 μm by fixedly mounting it on a wafer holder 204 provided in the bias sputtering apparatus shown in the FIG. 2 and applying a bias of –40 V as in the prior case previously described. The wafer susceptor employed here is that adopting an electrostatic attraction system according to the present inventor, which is capable of arbitrarily controlling a wafer potential (Wafer Susceptor Apparatus, Japanese Patent Application No. 61-131188).

FIG. 1(*b*) illustrates here a photograph of a surface of the Al film so formed taken by a differential interference microscope.

Figure 5A:
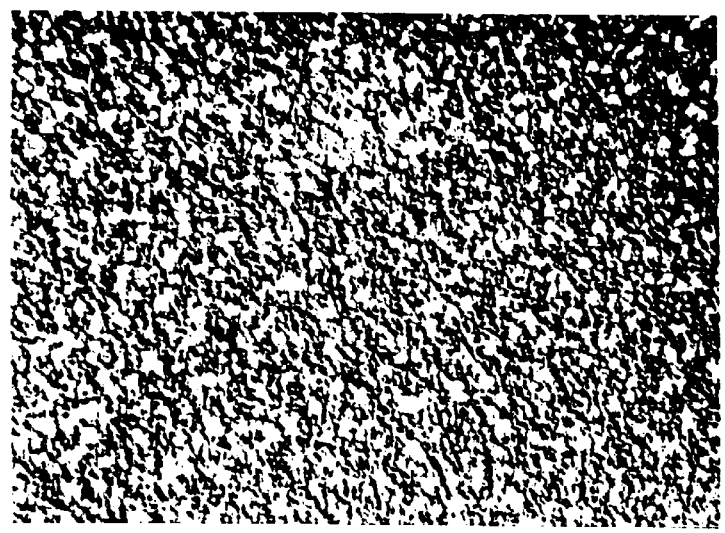
Figure 5B:
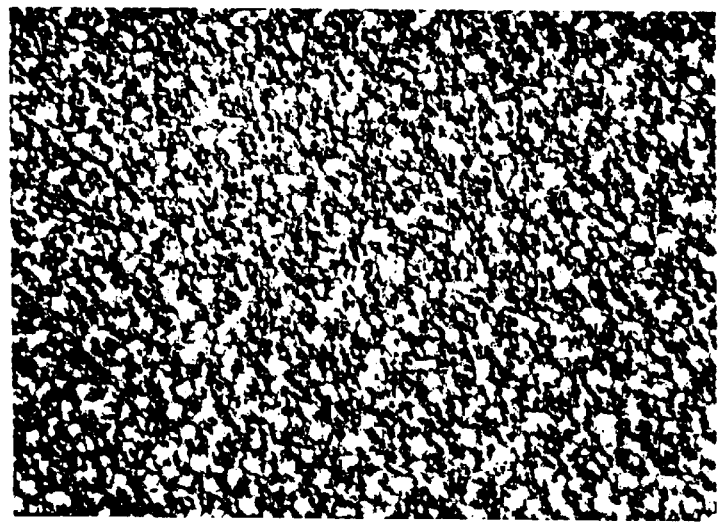

The photograph clearly shows that a very smooth surface can be assured compared with the prior example which is biased with –40 V. In addition, the same figure (c) is another photograph of the surface of the Al film kept in the same state as in FIG. (b) but it is annealed for 30 minutes at 400° C. No hillock production is observed followed by no change in surface structure. In the prior example, the wafer surface after annealing at 400° C. become very rough irrespective of the presence of absence of any bias and many hillocks are produced (FIG. 5). Against this, it is found that the silicon wafer of the present invention can assure a marvelously high quality Al film.

This is due to the fact that the potential of the semiconductor wafer 101 an be precisely controlled by a DC power source 208. That is, since the semiconductor wafer 101 of the present invention is supplied with the metal silicide layer 102 on the back thereof via the n⁺ region 103, satisfactory ohmic contacts can be attained at the interface between the silicon wafer 101 and the N⁺ silicide and also at the interface between the metal silicide and the surface of the metal wafer holder 204.

According to the present invention, in such a manner, precise control of the wafer potential can be achieved in a bias sputtering process for example and the formation of a very high quality Al film can be realized. As a result, precise fine processing for Al wiring can be attained together with an increase of life of the Al wiring due to electromigration, without causing any short circuit among layers in multi-layer wiring due to hillock production.

Maximum permissible current density, in consideration of an electromigration-resisting characteristic of the Al wiring, was $5 \times 10^4$ A/cm² up to now, but the present invention improves it to $5 \times 10^5$ A/cm² or more.

Figure 1A:
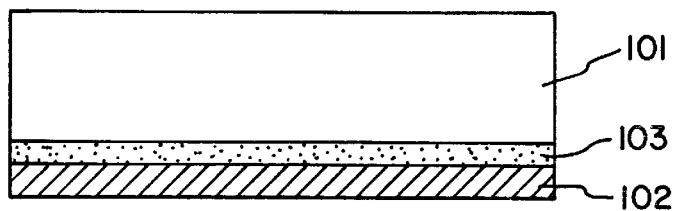
FIG. 1(*a*) is a cross section illustrating a first embodiment of a semiconductor apparatus according to the present invention.
Figure 1D:
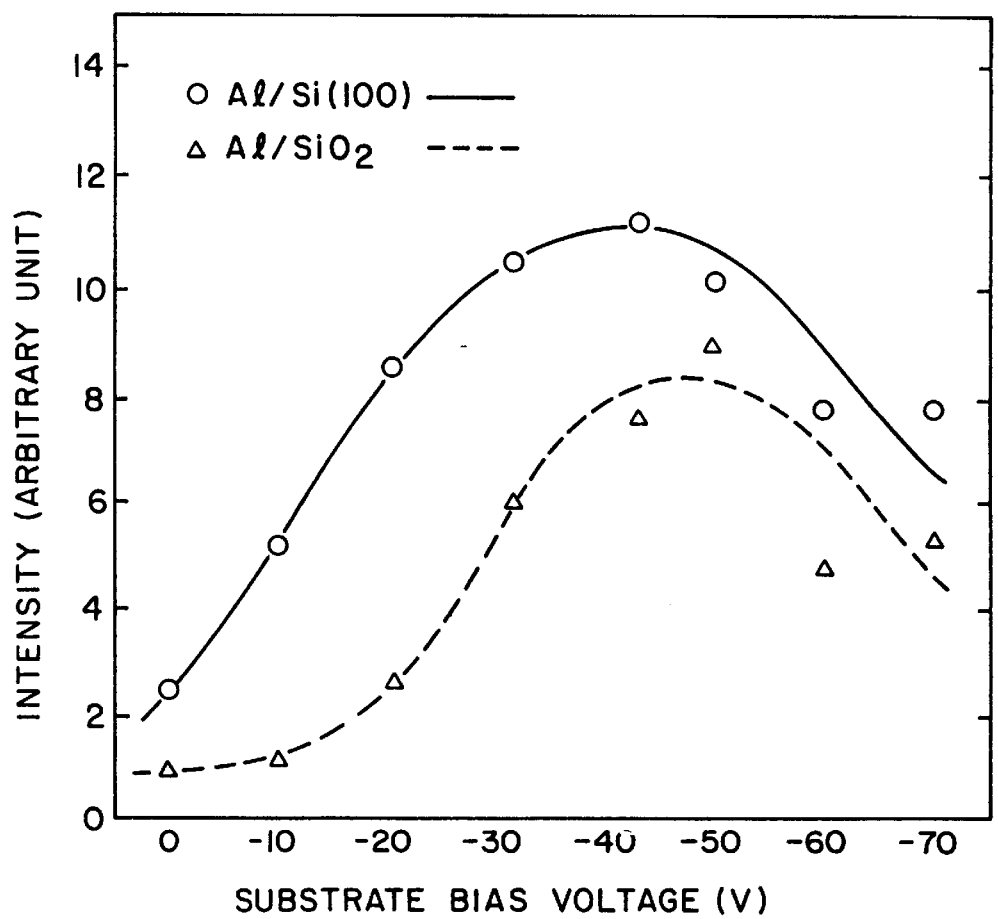
Figure 1B:
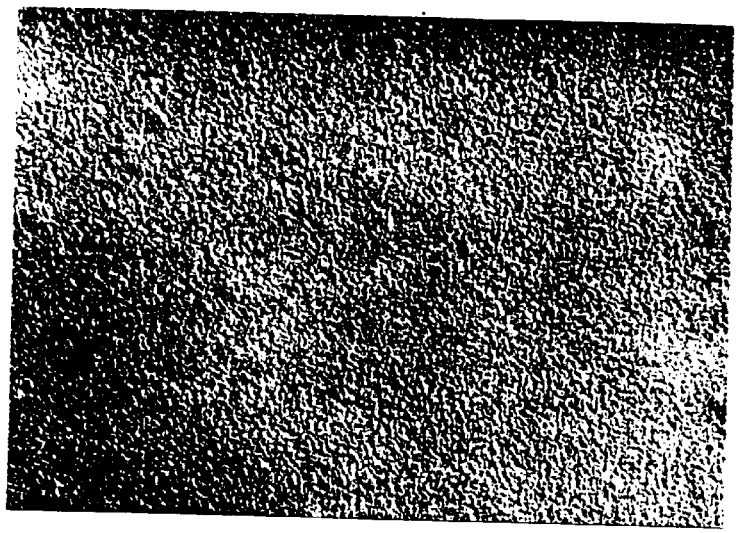
Figure 1C:
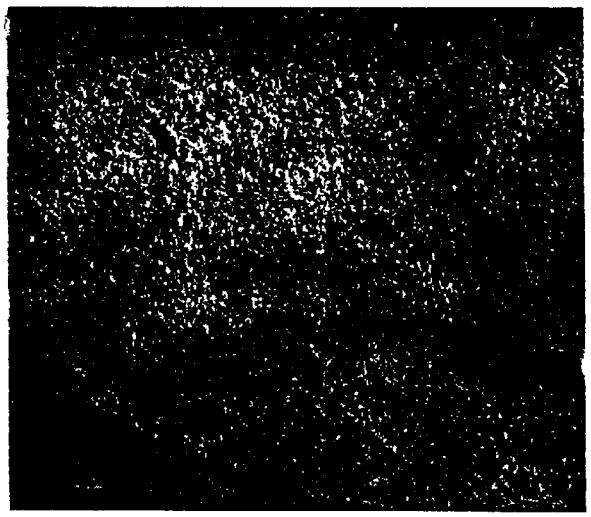

In succession, an assessment, by X-radiation, of the crystallizability of an Al film (thickness about 1.5 $\mu$m) formed by changing the bias to a silicon wafer from 0 V to −70 V by use of the wafer of the present invention will be described. Al films oriented only in the (111) direction are yielded in all biases. FIG. 1(d) illustrates peak intensity of reflection of X-radiation from the (111) plane as a function of biases to the wafer upon film formation by sputtering, and represents how the degree of crystallization in the (111) direction changes with those biases. The degree of crystallization is maximum in the vicinity of the bias of −40 V as evidenced from the figure.

As the figure shows, the wafer of the present invention precisely controls physical properties of the Al film. Such Al films are formed in all cases at room temperature and exhibit resistivity substantially equal to that of bulk Al (measured values range from 2.80 to 2.81 $\mu\Omega$·cm).

Figure 7:
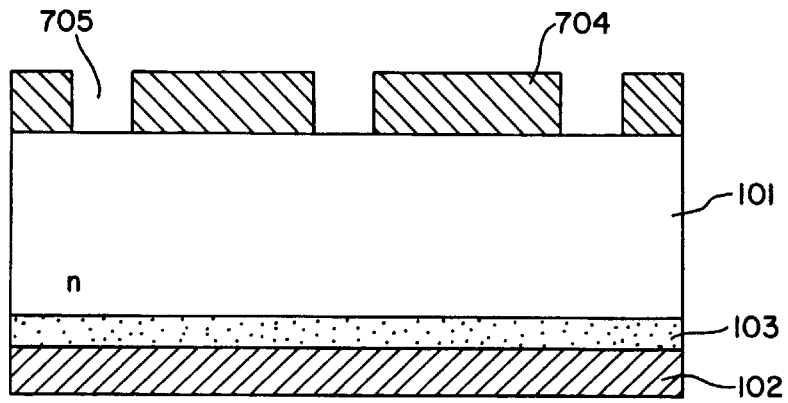
FIG. 7–FIG. 11 are illustrations showing the embodiments of the present invention.

FIG. 7 is a cross section of the second embodiment in which numerals 101 to 103 designate the same parts as those shown by the same numerals in FIG. 1. The present embodiment is adapted to permit SiO₂ 704 to be formed by about 1 $\mu$m on the surface of a wafer 101, while providing openings 705 for exposing the wafer surface. The wafer arranged as such is fixedly mounted on the wafer holder 204 shown in FIG. 2, and the same experiment as that of the first embodiment is performed with the substantially same results as those illustrated in FIG. 1(b) and (c). In addition, FIG. 1(d) also shows experimental results about an Al film so formed on the SiO₂. In the wafer structure of FIG. 7, the n type silicon substrate 101 is negative in the potential against the Al film formed, and hence a Schottky diode provided between the growing Al film and the Si substrate 101 is forwardly biased to permit a forward current to flow therethrough for thereby allowing a potential of the growing Al film to become substantially the same as that of the wafer.

Figure 8:
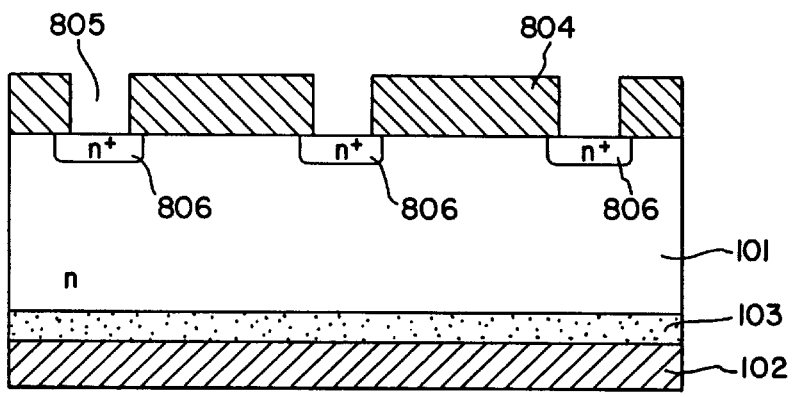

FIG. 8 is a cross section illustrating a third embodiment of the present invention adapted to further precisely control also a potential of a growing Al film. That is, an n⁺ diffusion layer 806 is formed in openings 805 of a SiO₂ film 804. This arrangement can perfectly establish ohmic contact between the growing Al film and a substrate for thereby furthermore securing the potential control of the Al film. Particularly, this arrangement is needed absolutely when a p type substrate is employed. The reason is that the interface between Al and the p type is back biased. It is thereupon a matter of course the N⁺ layer 103 and the n⁺ diffusion layer should be both altered to p⁺ layers.

Figure 9:
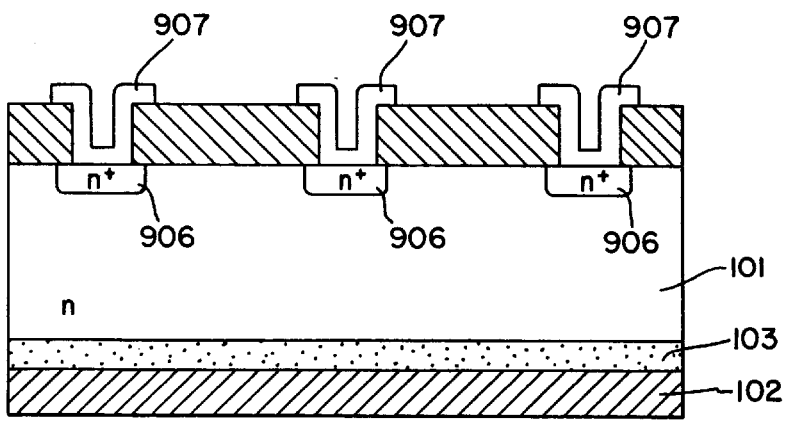

Moreover, FIG. 9 illustrates a fourth embodiment of the present invention wherein a metal layer 907 is provided on the N⁺ layer in order to further improve the potential control.

This metal layer 907 is made of Al and is subject to patterning by making use of a technique of photolithography. Any metal other than Al or metal silicide and the like can be employed, as a matter of course.

Figure 10:
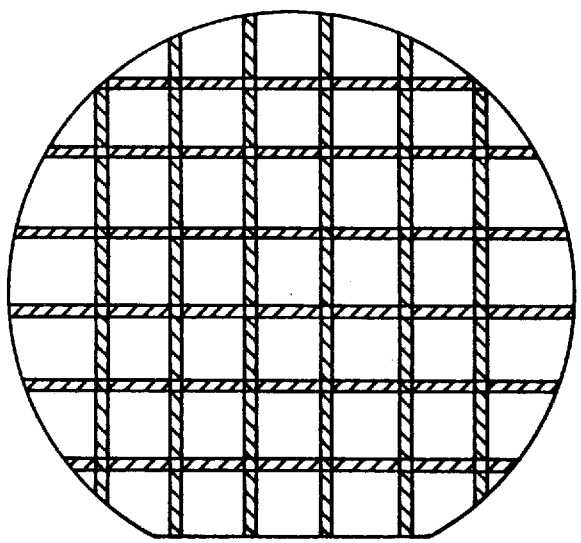

FIG. 10 illustrates here a fifth embodiment of the present invention wherein an exemplary arrangement, on the wafer, of the parts (705, 805, 907) for establishing electrical contact between the wafer and the growing Al film is exhibited. Such a lattice-shaped arrangement is preferable for controlling the potential of an Al film as uniformly as possible. In fact, as for the opening parts 705, 805, and 907, the use of dicing lines lying among chips on the wafer as they are makes it unnecessary to provide an additional region for the potential control.

Upon forming generally an Al film on an insulating film as in the second to fifth embodiments (FIG. 7 to 10), the following method is possible. For instance, in the bias sputtering apparatus shown in FIG. 2, when an Al film is formed by setting the target potential to −150 V for example, a uniform layer with thickness of from 50 to 100 Å is formed over the entire surface of the wafer for about 30 seconds. Thereafter, when the target bias is set within a range of from 500 V to 1kV for example, and film formation is effected at a high speed of 1 to 2 $\mu$m per minute by raising the potential of the radio frequency power source 201, a very high quality Al film is yielded compared with a case where initial low speed film formation is not effected.

The reason is that the Al film initially formed at a low speed presents a uniform structure with good crystallizability, which serves as a seed of Al film formation thereafter to promote the growth of the Al film formed at a high speed, and furthermore that the bias potential is supplied all over the entire surface of the insulating film to assure more uniform ion bombardment. In addition, we formed a silicon film on the wafer of the present invention (FIG. 1) by bias sputtering by use of the bias sputtering apparatus shown in FIG. 1. Thereupon, the temperature of the wafer holder 204 was set to 600° C. with the wafer bias falling within a range from −20 V to −30 V. Hereby, a very thin epitaxial silicon layer with thickness from 0.1 to 1 $\mu$m was successfully made to grow on the wafer surface.

Furthermore, the growth of the associated film at the low temperature of 600° C. can prevent rediffusion of any impurity from the substrate. Thus, the present invention has succeeded in perfectly preventing rediffusion of any impurity into a collector region of a bipolar transistor, which was conventionally a problem.

As clearly evidenced from the embodiments described above, the precise control of the wafer potential is a key factor upon making high quality variety of films for use as materials of ultra-LSIs.

Furthermore, almost all of the prior art process devices, up to now, generally treat thermochemical reactions with only limited external parameters, which are controllable from the outside, such as temperature, gas pressure, and gas flow rates, etc. Moreover, also in processes using electrical discharge the associated process is actually controlled by using spontaneous self bias as the wafer potential. However, all process parameters must be controlled from now on by making use of electronics for high quality and high precision in processes of the submicron sizes. Thereupon, the potential of the wafer itself to be processed is most important. It is accordingly obvious that the use of the wafer of the present invention is indispensable.

Figure 6:
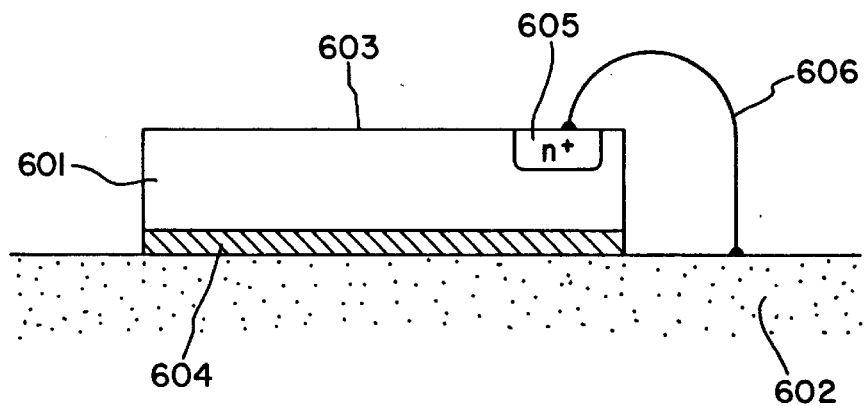
Figure 4A:
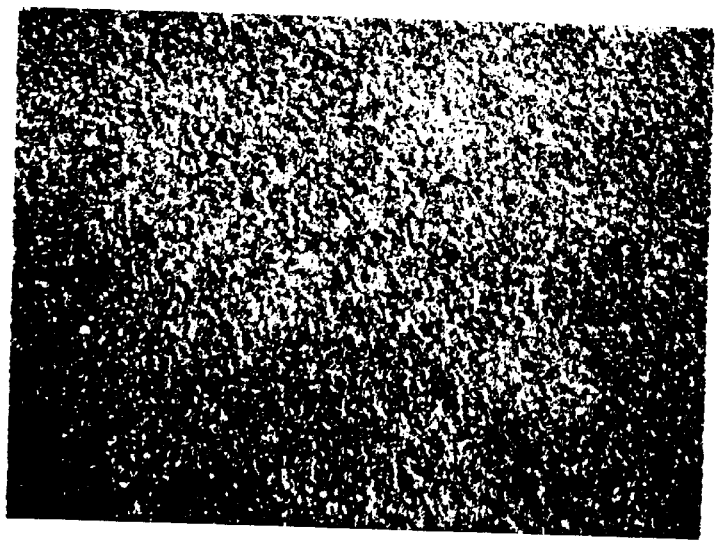
Figure 4B:
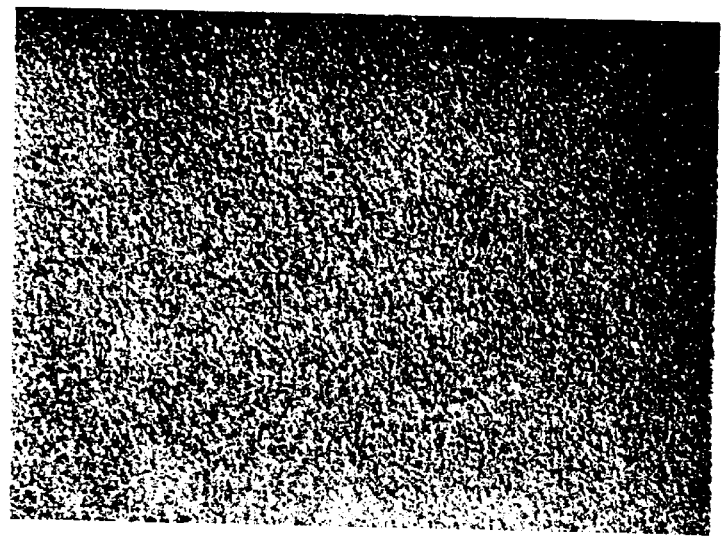
Figure 11:
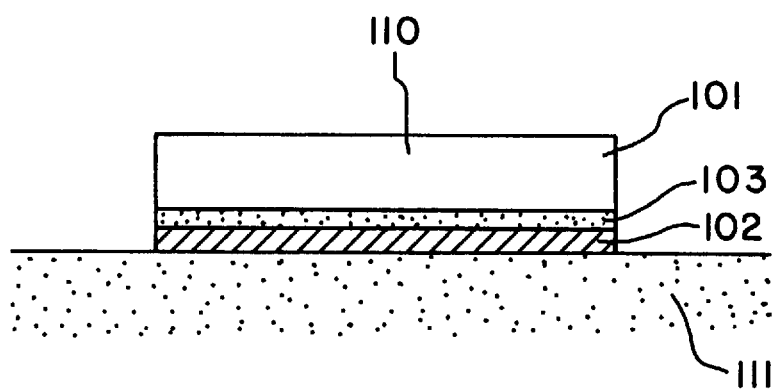

FIG. 11 is a cross section illustrating a sixth embodiment of the present invention, which corresponds to the prior example of FIG. 6 and in which a state of an LSI chip 110 being mounted on a package substrate 111 is diagrammatically drawn. This embodiment is adapted to couple the chip 110 with the package substrate through perfect ohmic contact to completely prevent the fluctuation of the substrate potential for permission of stable high speed operation. In order to further improve the electrical contact of the chip with the package, a metal electrode made of Au, etc., may be provided on a silicide layer. This embodiment does not require processes of lapping the back of the associated wafer and of depositing Au thereon, and hence simplifies a fabrication process.

In addition, when dynamic RAMs and image sensors are prepared with use of the wafer of the present invention, for example, storage characteristics of any memory, and dark currents and bad images in any image sensor can be greatly improved. This is considered to be due to a fact that defects are produced in the wafer back owing to any stress caused in the silicide layer, which influence includes heavy metal contamination in the silicon wafer.

Moreover, since the embodiments described above employ a high melting point metal silicide $WSi_2$ as the silicide layer, the wafers used in the embodiments can be processed in quite the same manner as those used for prior wafers in processes of wafer cleaning by acid or thermal oxidation of the same at a high temperature.

For such silicide, any of high melting point metal silicides other than $WSi_2$ such as $MoSi_2$, $TiSi_2$, $NbSi_2$, and $TaSi_2$, etc., may be, of course, employed, if heating, and cleaning and etching processes for the associated semiconductor wafer are taken into consideration. In addition, even for the film thickness other than that mentioned particularly in the present embodiments, the same effect can also, of course, be attained.

Moreover, provided the wafer process at low temperature is assured, it is not necessarily required to employ only high melting point metal silicides, and instead Pt silicide, Ni silicide, and Pd silicide, etc., for example, may be employed depending on the process temperature.

In addition, although in the embodiments described above, the cases with use of, chiefly, an n type substrate were described, the same effect can be obviously expected also for a p type substrate if a silicide layer is formed via a $p^+$ layer. Thereupon, for the silicide layer, silicide formed by sputtering or silicide formed by permitting any metal after formed on the wafer back to react with silicon may be employed. Moreover, for the $N^+$ layer or $p^+$ layer, they may be formed by way of diffusion and ion injection, or doped polysilicon may be deposited directly on the wafer back.

Although the foregoing was described for the silicon wafer as an example, it may be applied in quite the same manner to compound semiconductor wafers, of course. For example, metal silicide may be formed on a $n^+$ layer which is doped with Si and formed on the back of a GaAs substrate.

Furthermore, since the GaAs wafer process is a low temperature one in itself, for the low resistance electrode used on the back of the wafer, metals other than Au and W, etc., may be employed without any limitation to the silicide, of course.

In the embodiments of the present invention, only the wafer has been described, which is adapted to include the low resistance electrode provided on the back of the wafer via the high concentration impurity layer as shown in FIG. 1.

However, when the wafer of the present invention is applied to actual processes, there are processes which do not necessarily require control of the wafer potential as in film formation by a CVD process, thermal oxidation, and the like for example. Although, in those cases, a wafer arranged to cover a low resistance electrode surface with a silicon oxide film and a silicon nitride film or other materials may be employed for example, the present invention includes, as a matter of course, semiconductor apparatuses using such a wafer. This insulating film of course presents the same effect as in the previous case, provided it is removed prior to a process in need of controlling a wafer potential. Thereupon, the low resistance electrode may be exposed over the whole surface thereof, or partly responding to the need.

Furthermore, although FIG. 11 illustrates a construction which shows that a low resistance electrode, provided on the back of the wafer and left as it is, is mounted on a package, the embodiments of the present invention are not limited thereto. For example, a semiconductor device capable of demonstrating its function satisfactorily with a wafer potential only taken from the surface thereof may be mounted after removing the high concentration layer 103 and silicide layer 102 by lapping. In this case, the mounted chip is improved by leaps and bounds in pattern accuracy thereof and qualities of various films compared with cases of the use of prior wafers, since the wafer potential can be controlled in the course of its fabrication process by the arrangement of the present invention of FIG. 1. Accordingly, the semiconductor device so finished exhibits very excellent characteristics and reliability against prior techniques.

The present invention is basically to provide, as described above, a wafer arrangement capable of controlling a wafer potential in the associated processes, and thus the present invention includes high performance LSI chips of all sorts prepared by use of that structure.

According to the present invention, as described above, precise control of a semiconductor substrate potential can be assured not only during a wafer process but after chip mounting to thereby enable ultrahigh density and ultra-high speed LSIs to be put into practice.

We claim:

1. A method of forming a semiconductor device, comprising the steps of:

forming a high concentration impurity layer on a first surface of a wafer, wherein the impurity concentration of the impurity layer is higher than that of the wafer;

forming a low resistance layer on a surface of the high concentration impurity layer opposite the wafer;

placing the wafer on a wafer holder such that the low resistance layer contacts the wafer holder and a secure ohmic contact is established between the wafer and the wafer holder; and forming a thin film on a second surface of the wafer opposite the low resistance layer.

2. The method of claim 1, wherein the impurity concentration of the impurity layer is at least $1 \times 10^{18}$ $cm^3$.

3. The method of claim 1, wherein the wafer is composed of silicon and wherein the low resistance layer is a metal silicide layer.

4. The method of claim 3, wherein the metal silicide layer is a high melting point metal silicide.

5. The method of claim 1, wherein the wafer is a compound semiconductor.

6. The method of claim 4, wherein the low resistance layer is composed of metal silicide.

7. The method of claim 2, wherein the wafer is composed is silicon and wherein the low resistance layer is a metal silicide layer.

8. The method of claim 2, wherein the wafer is a compound semiconductor.

9. The method of claim 1, wherein the low resistance layer is composed of metal silicide.

10. The method of claim 2, wherein the low resistance layer is composed of metal silicide.

11. The method of claim 1, wherein the low resistance layer is composed of metal.

12. The method of claim 2, wherein the low resistance layer is composed of metal.

13. The method of claim 1 including the step of forming a semiconductor layer on the second surface of the wafer.

14. The method of claim 13 wherein the step of forming the semiconductor layer includes forming openings in the semiconductor layer.

15. The method of claim 13, wherein the metallic layer is formed on a portion of the surface of the semiconductor layer.

* * * * *